(12) United States Patent
Lee et al.

(10) Patent No.: US 9,859,001 B2
(45) Date of Patent: Jan. 2, 2018

(54) METHOD FOR SWITCHING MEMORY RESISTANCE BY NEAR-INFRARED LASER BEAM

(71) Applicant: Pukyong National University Industry-University Cooperation Foundation, Busan (KR)

(72) Inventors: Yongwook Lee, Busan (KR); Jihoon Kim, Gyungsangnam-do (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 36 days.

(21) Appl. No.: 14/801,827

(22) Filed: Jul. 17, 2015

(65) Prior Publication Data
US 2016/0336065 A1 Nov. 17, 2016

(30) Foreign Application Priority Data

May 15, 2015 (KR) ........................ 10-2015-0068154

(51) Int. Cl.
| | | |
|---|---|---|
| *G11C 11/00* | (2006.01) | |
| *G11C 13/00* | (2006.01) | |
| *G11C 13/04* | (2006.01) | |

(52) U.S. Cl.
CPC ........ *G11C 13/0069* (2013.01); *G11C 13/047* (2013.01); *G11C 13/0007* (2013.01); *G11C 2013/008* (2013.01)

(58) Field of Classification Search
CPC ............ G11C 13/0007; G11C 13/0069; G11C 2213/32; G11C 2213/55; G11C 2213/77; G11C 2213/56
See application file for complete search history.

(56) References Cited

U.S. PATENT DOCUMENTS

| | | | | | |
|---|---|---|---|---|---|
| 5,413,959 | A * | 5/1995 | Yamamoto | .......... | H01L 31/0236 136/256 |
| 7,729,044 | B2 * | 6/2010 | Theberge | .............. | G02F 1/3511 359/326 |
| 7,781,030 | B2 * | 8/2010 | Tsuchiya | .................. | G01J 5/20 250/338.1 |
| 2004/0184318 | A1 * | 9/2004 | Morikawa | ........... | G11C 11/5685 365/185.17 |
| 2005/0117388 | A1 * | 6/2005 | Cho | .................. | G11C 13/0004 365/163 |
| 2005/0274702 | A1 * | 12/2005 | Deshi | ..................... | B23K 26/40 219/121.72 |
| 2011/0122895 | A1 * | 5/2011 | Savage-Leuchs | ..... | H01S 3/0941 372/10 |

(Continued)

OTHER PUBLICATIONS

Memristive Switching in Planar Devices Based on Vanadium Dioxide Thin Films Using Near IR Laser Pulses Jihoon Kim (1), Kyongsoo Park (2), Songhyun Jo (2), Bong-Jun Kim (3), and Yong Wook Lee (1,2) Oct. 25-28, 2015.*

*Primary Examiner* — Hien Nguyen
(74) *Attorney, Agent, or Firm* — Revolution IP, PLLC

(57) ABSTRACT

A method for switching a memory resistance, including: changing a memory resistance of an oxide thin film of a semiconductor device by irradiating a near-infrared laser beam onto the oxide thin film, the semiconductor device having the oxide thin film formed on a substrate and two terminals formed at both ends of the oxide thin film.

5 Claims, 3 Drawing Sheets

(56) References Cited

U.S. PATENT DOCUMENTS

2012/0264235 A1* 10/2012 Hiraoka .................. H01L 51/56
                                                           438/4
2016/0019954 A1*  1/2016 Vaskivskyi ........ G11C 13/0002
                                                           365/163

* cited by examiner

METHOD FOR SWITCHING MEMORY RESISTANCE BY NEAR-INFRARED LASER BEAM This application claims the benefit of Korean Patent Application No. 10-2015-0068154, filed on May 15, 2015, which is hereby incorporated by reference as if fully set forth herein.

BACKGROUND OF THE INVENTION

Field of the Invention

The present invention generally relates to a method for switching a memory resistance, and more particularly, to a method for switching a memory resistance state of a memristor by irradiating a near-infrared laser beam on a thin film of a device having memory resistance properties, which is fabricated based on a vanadium dioxide ($VO_2$) thin film.

Discussion of the Related Art

The memristor was originally proposed in 1971 by L. Chua as the fourth element in addition to the existing three lumped parameters, Capacitor, Inductor and Resistor. However, it was not until 2008 when a first practical device based on titanium oxide was built at HP.

The memristor, which memorizes the amount of electric charge that has passed through the device, acts as a memory resistor that stores information from the viewpoint of a device resistor. If the memristor is used in combination with a semiconductor circuit, the number of transistors and fabrication cost for an integrated circuit can be significantly reduced. Particularly when a resistance random access memory is fabricated using a memristor, a non-volatile high-speed/large-capacity memory device can be fabricated. Thus, it is expected that the existing flash memory will be replaced with the resistance random access memory.

Accordingly, there is a need for developing an electrical switching method for a memristor-based semiconductor device.

SUMMARY OF THE INVENTION

Accordingly, the present invention is directed to a method for switching a memory resistance that substantially obviates one or more problems due to limitations and disadvantages of the related art.

An object of the present invention is to provide a memristor-based memory resistance switching method.

To achieve these objects and other advantages and in accordance with the purpose of the invention, as embodied and broadly described herein, a method for switching a memory resistance includes changing a memory resistance of an oxide thin film of a semiconductor device by irradiating a near-infrared laser beam onto the oxide thin film, the semiconductor device having the oxide thin film formed on a substrate and two terminals formed at both ends of the oxide thin film.

The irradiating the near-infrared laser beam is conducted by controlling a driving current and pulse duration of the near-infrared laser beam.

The method may further include inputting a temperature bias in a predetermined temperature range to the oxide thin film to keep the oxide thin film at a constant temperature.

The oxide thin film may be a vanadium dioxide ($VO_2$) thin film.

The near-infrared laser beam may have a wavelength of 966 nm.

The temperature range may be from 40° C. to 85° C.

It is to be understood that both the foregoing general description and the following detailed description of the present invention are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The objects and effects of the present invention and technical structures to achieve them will become apparent to those having ordinary skill in the art upon examination of the following embodiments of the present invention described with reference to the attached drawings. A detailed description of known functions or constructions will be omitted lest it should obscure the subject matter of the present invention. Terms used herein are defined in consideration of structures, roles, and functions according to the present invention and may be changed according to the intention of a user or an operator or customs.

However, the present invention is not limited to the embodiments described below. Rather, the present invention may be implemented in many other ways. The embodiments of the present invention are provided to make the disclosure of the present invention comprehensive and give a comprehensive scope of the present invention to those skilled in the art. The present invention is defined by the scope of the claims and the definition should be made based on the comprehensive contents of the present specification.

As used in the present disclosure, terms such as "includes" or "may include" refer to the presence of the corresponding component and is not intended to exclude one or more additional components, unless otherwise specified.

Now, a detailed description will be given of preferred embodiments of the present invention with reference to the attached drawings.

Figure 1:
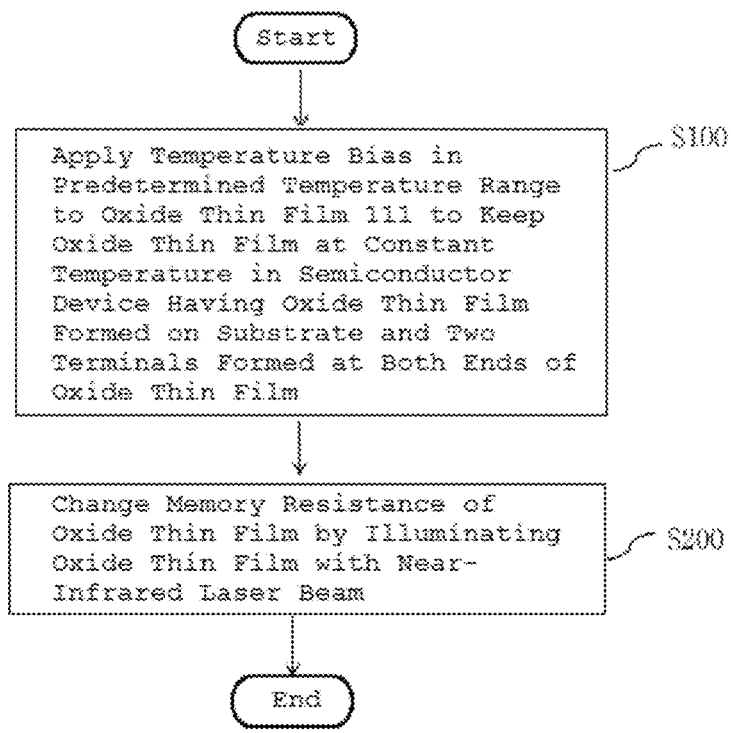
FIG. 1 is a flowchart illustrating a method for switching a memory resistance according to an embodiment of the present invention.
Figure 2:
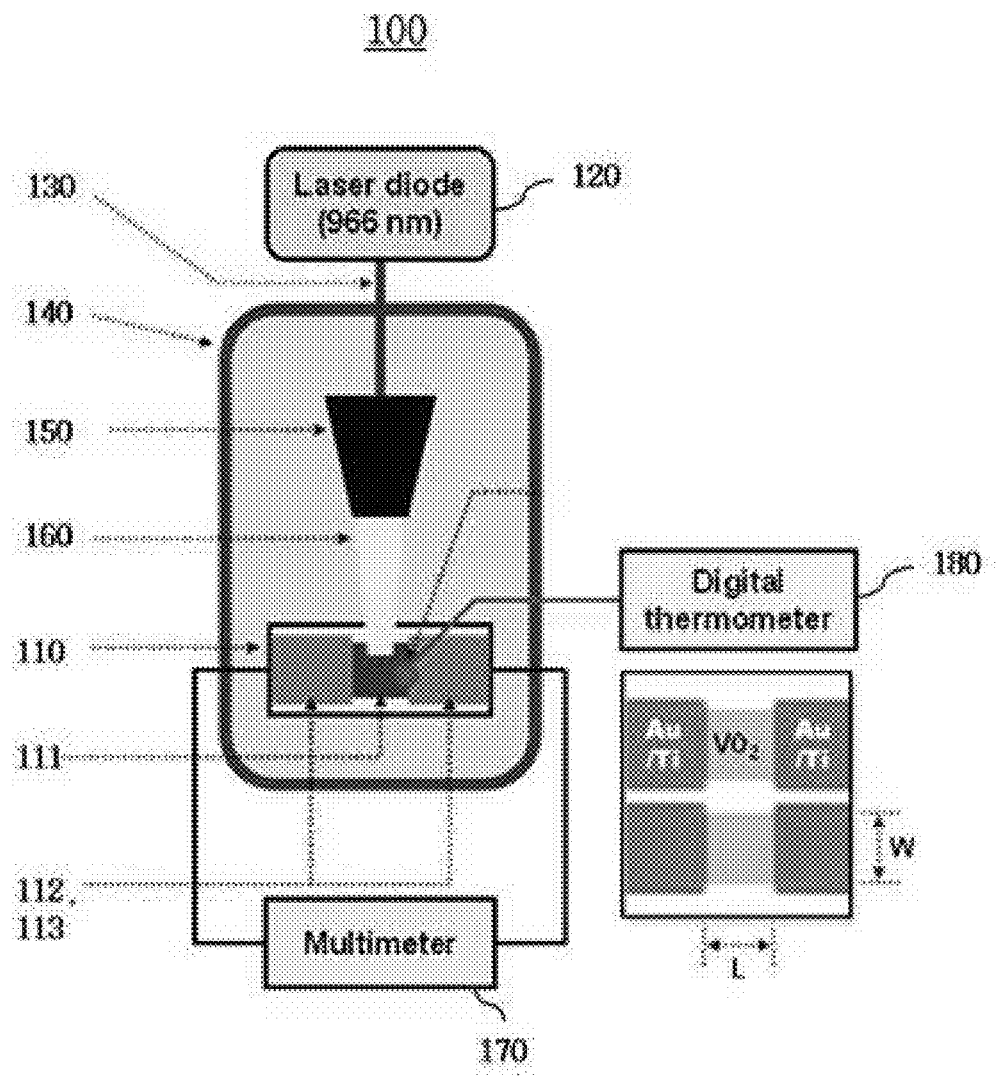
FIG. 2 is a diagram illustrating a system for testing the memory resistance switching method according to an embodiment of the present invention.

FIG. 1 is a flowchart illustrating a method for switching a memory resistance according to an embodiment of the present invention, and FIG. 2 is a diagram illustrating a system for testing the memory resistance switching method according to an embodiment of the present invention.

Referring to FIGS. 1 and 2, an oxide semiconductor device 110 is formed by forming an oxide thin film 111 on a substrate and forming two terminals 112 and 113 at both ends of the oxide thin film 111. The two terminals 112 and 113 may be connected to both ends of the oxide thin film 112 and formed into titanium-gold electrodes.

The oxide thin film 111 may be formed of any oxide semiconductor material as far as the oxide semiconductor material is capable of electrical switching. Preferably, the oxide thin film 111 may be a vanadium dioxide ($VO_2$) thin film.

In a method for switching a memory resistance according to an embodiment of the present invention, a temperature bias is inputted in a predetermined temperature range in order to keep the oxide thin film 111 at a constant temperature in the semiconductor device 110 having the oxide thin film 111 formed on the substrate and the two terminals 112 and 113 formed at both ends of the oxide thin film 111 (S100).

The temperature bias may range from 40° C. to 85° C., preferably from 71° C. to 72° C. In the embodiment of the present invention, the temperature of the oxide thin film 111 is kept constant by maintaining the bias temperature in a chamber 140.

If the oxide thin film 111 is a vanadium dioxide ($VO_2$) thin film, the bias temperature is applied in the above temperature range. However, if the oxide thin film 111 is formed of any other material, the method for switching a memory resistance according to the embodiment of the present invention may be implemented at room temperature without applying a bias temperature within a predetermined temperature range. Accordingly, a memory resistance may be switched at room temperature without applying a bias temperature within a predetermined temperature range in the method for switching a memory resistance according to the embodiment of the present invention.

Subsequently, the memory resistance of the oxide thin film 111 is changed by irradiating a near-infrared laser beam onto the oxide thin film 111 (S200).

More specifically, a near-infrared laser diode 120 irradiates a laser beam 160 onto the oxide thin film 111 by focusing the laser beam 160 using an optical fiber 130 and a beam concentrator 150. The wavelength of the laser beam 160 may be 966 nm.

The resistance value of the oxide thin film 111 is measured by means of a multi-meter 170 connected to the terminals 112 and 113 and the temperature of the oxide thin film 111 is monitored by means of a digital thermometer 180.

The resistance value of the oxide thin film 111 may be changed by controlling the current and pulse duration of a driving current applied to the near-infrared laser diode 120. In this manner, memory resistance switching may be performed.

Figure 3:
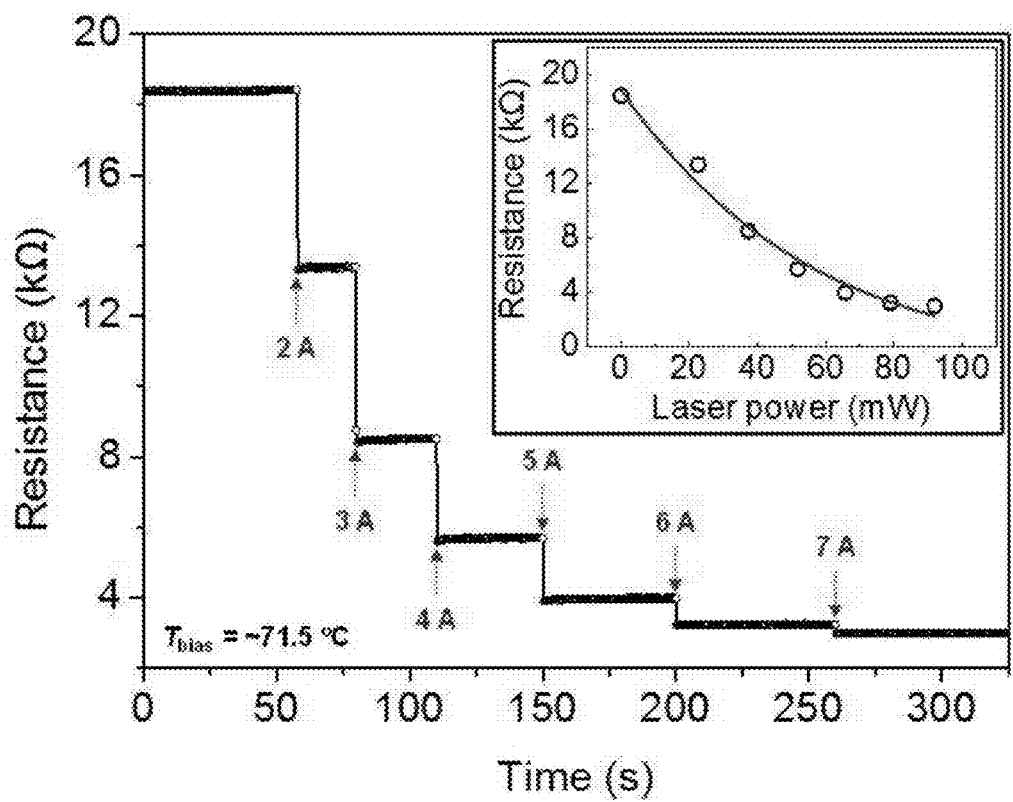
FIG. 3 is a graph illustrating memory resistance variations in the memory resistance switching method according to an embodiment of the present invention.

FIG. 3 is a graph illustrating memory resistance variations in the memory resistance switching method according to an embodiment of the present invention.

Referring to FIG. 3, it is noted that the resistance value of the oxide thin film 111 has been changed by six consecutive laser pulses. In FIG. 3, red reference numerals 2A, 3A, 4A, 5A, 6A, and 7A denote laser driving currents. If a near-infrared laser beam is applied to the oxide thin film 111 with the driving current 2A, the resistance value is changed and kept changed. Then, if a near-infrared laser beam is applied to the oxide thin film 111 with the driving current 3A, the resistance value is changed and kept changed. In the same manner, if a near-infrared laser beam is applied to the oxide thin film 111 with the driving current 4A, the resistance value is changed and kept changed.

Thus, it may be concluded that the oxide thin film 111 may have various resistance states through laser irradiation onto the oxide thin film 111 and may be kept at a changed resistance value, which makes it possible to use the oxide semiconductor device 110 as a memory device.

In this manner, memristor properties can be achieved by changing the resistance value of the oxide thin film 111 through control of the driving current and pulse duration of a near-infrared laser beam projected onto the oxide thin film 111.

Since a near-infrared absorption rate is decreased after phase transition of the vanadium dioxide ($VO_2$) thin film, heat may be cooled faster by use of a near-infrared laser than a visible laser. As a result, memory resistance fluctuates less than in a conventional technology shortly after laser projection and thus fast stabilization may be achieved.

As is apparent from the foregoing description of the method for switching a memory resistance according to an embodiment of the present invention, since the resistance of a device is switched by irradiating a laser beam onto an active region of the device without applying electrical pulses, there is no need for an additional circuit.

Further, a semiconductor device is fully separated from an light irradiation portion. The resulting elimination of an incident cause such as a short circuit can decrease malfunction and thus increase system reliability.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A method for switching a memory resistance, the method comprising:
    irradiating a near-infrared laser beam onto an oxide thin film of a semiconductor device having the oxide thin film formed on a substrate and two terminals formed at both ends of the oxide thin film;
    adjusting laser power of the near-infrared laser beam with varying current values and pulse duration of a driving current applied to the near-infrared laser diode which irradiates the near-infrared laser beam,
    wherein the step of adjusting increases, decreases, and/or maintains the memory resistance of the oxide thin film.

2. The method according to claim 1, further comprising inputting a temperature bias in a predetermined temperature range to keep the oxide thin film at a constant temperature.

3. The method according to claim 1, wherein the oxide thin film is a vanadium dioxide (VO2) thin film.

4. The method according to claim 1, wherein the near-infrared laser beam has a wavelength of 966 nm.

5. The method according to claim 2, wherein the temperature range is from 40° C. to 85° C.

* * * * *